(12) United States Patent
Moriyama

(10) Patent No.: US 7,732,935 B2
(45) Date of Patent: Jun. 8, 2010

(54) WIRING BOARD, ELECTRONIC CIRCUIT BOARD, ELECTRONIC APPARATUS AND MANUFACTURING METHOD OF ELECTRONIC CIRCUIT BOARD

(75) Inventor: Eiji Moriyama, Tottori (JP)

(73) Assignees: Ricoh Company, Ltd., Tokyo (JP); Ricoh Microelectronics Co., Ltd., Tottori (JP)

( * ) Notice: Subject to any disclaimer, the term of this patent is extended or adjusted under 35 U.S.C. 154(b) by 492 days.

(21) Appl. No.: 11/408,123

(22) Filed: Apr. 20, 2006

(65) Prior Publication Data

US 2006/0214297 A1    Sep. 28, 2006

Related U.S. Application Data

(63) Continuation of application No. PCT/JP2005/014748, filed on Aug. 11, 2005.

(30) Foreign Application Priority Data

| Aug. 12, 2004 | (JP) | ............... 2004-235438 |
| Aug. 12, 2004 | (JP) | ............... 2004-235448 |
| Jul. 26, 2005 | (JP) | ............... 2005-215800 |

(51) Int. Cl.
*H01L 23/48* (2006.01)
(52) U.S. Cl. .............. 257/784; 257/E23.019; 257/E23.025; 257/E23.06; 257/E23.077; 257/E21.503; 257/786; 257/668; 257/752
(58) Field of Classification Search ........... 257/784, 257/786, 668, 752, E23.019, E23.025, E21.503, 257/E23.06, E23.077
See application file for complete search history.

(56) References Cited

U.S. PATENT DOCUMENTS

| 3,394,527 | A | * | 7/1968 | McLean ............... 52/741.1 |
| 6,146,764 | A | * | 11/2000 | Suokas et al. ........... 428/412 |
| 6,515,744 | B2 | * | 2/2003 | Wei .................... 356/369 |
| 6,678,144 | B2 | * | 1/2004 | Higashi et al. .......... 361/306.3 |
| 6,698,648 | B2 | * | 3/2004 | Wunderlich et al. ....... 228/215 |
| 6,744,135 | B2 | * | 6/2004 | Hasebe et al. ........... 257/712 |
| 7,067,918 | B2 | * | 6/2006 | Murata et al. ........... 257/751 |
| 7,141,874 | B2 | * | 11/2006 | Nakatani ............... 257/700 |
| 7,425,762 | B2 | * | 9/2008 | Hasebe et al. ........... 257/712 |
| 7,486,001 | B2 | * | 2/2009 | Kando ................. 310/313 R |
| 2001/0026888 | A1 | | 10/2001 | Yokoyama et al. |
| 2003/0052157 | A1 | | 3/2003 | Wunderlich et al. |
| 2003/0080397 | A1 | | 5/2003 | Sakuyama et al. |

(Continued)

FOREIGN PATENT DOCUMENTS

EP    0654818 A1    5/1995

(Continued)

OTHER PUBLICATIONS

Jun. 18, 2009 European search report in connection with a counterpart European patent application No. 05 77 0814.

*Primary Examiner*—Alexander O Williams
(74) *Attorney, Agent, or Firm*—Cooper & Dunham LLP

(57) ABSTRACT

A wiring board includes a substrate made of an insulation material and wired by a conductive material. A plurality of electrodes is formed on a surface of the substrate. A non-Au electrode not having an Au surface layer and an Au electrode having the Au surface layer are formed as the electrodes.

17 Claims, 12 Drawing Sheets

U.S. PATENT DOCUMENTS

| | | |
|---|---|---|
| 2004/0060169 A1 | 4/2004 | Yokoyama et al. |
| 2004/0106232 A1 | 6/2004 | Sakuyama et al. |
| 2005/0112880 A1* | 5/2005 | Wood et al. ............... 438/689 |
| 2007/0242440 A1* | 10/2007 | Sugaya et al. ............. 361/762 |

FOREIGN PATENT DOCUMENTS

| | | |
|---|---|---|
| JP | 58-192351 | 11/1983 |
| JP | 2-296336 | 12/1990 |
| JP | 2001-283805 | 10/2001 |
| JP | 2001-308268 | 11/2001 |
| JP | 2002-8626 | 1/2002 |
| JP | 2002-368038 | 12/2002 |
| JP | 2003-204148 | 7/2003 |
| JP | 2003-282630 | 10/2003 |
| JP | 2003-318308 | 11/2003 |
| JP | 2004-171964 | 6/2004 |
| JP | 2005-12022 | 1/2005 |

* cited by examiner

WIRING BOARD, ELECTRONIC CIRCUIT BOARD, ELECTRONIC APPARATUS AND MANUFACTURING METHOD OF ELECTRONIC CIRCUIT BOARD

CROSS-REFERENCE TO RELATED APPLICATION

This application is a U.S. continuation application filed under 35 USC 111(a) claiming benefit under 35 USC 120 and 365(c) of PCT application JP2005/14748, filed Aug. 11, 2005, which claims priority to Applications Ser. No. 2004-235438 filed in Japan on Aug. 12, 2004, No. 2004-235448 filed in Japan on Aug. 12, 2004, and No. 2005-215800 filed in Japan on Jul. 26, 2005. The foregoing applications are hereby incorporated herein by reference.

BACKGROUND

1. Technical Field

This disclosure relates to a wiring board such as a printed wiring board where plural electrodes are formed on a surface of a substrate made of an insulation material for mounting on electronic part such as IC chip or a condenser, an electronic circuit board, an electronic apparatus and a manufacturing method of the electronic circuit board.

2. Description of the Related Art

Conventionally, electronic circuit boards, such as module boards where electronic parts are mounted on wiring boards, have been widely used for various kinds of electronic apparatuses. As the size of the electronic apparatus becomes smaller, it is required to make a mounting area on a wiring board of an IC chip small. Such a requirement of small size is discussed with reference to FIG. 1 through FIG. 3.

Here, FIG. 1 is a schematic structural view of a related art Quad Flat Package (QFP) as an IC chip. FIG. 2 is a schematic structural view of a related art electronic circuit board manufactured by an old type Chip On Board (COB) process wherein a bare chip 2 as an IC ship is connected to a wiring board by wire bonding. FIG. 3 is a schematic structural view of a related art electronic circuit board manufactured by a new type Chip On Board (COB) process wherein the bare chip is mounted as a flip chip.

The Related Art Quad Flat Package (QFP) shown in FIG. 1 includes a bare chip 2, plural lead electrodes 3, a package 4, and others. Plural electrode pads are formed on a surface of the bare chip 2. The package 4 is made of a resin material for sealing the periphery of the bare chip 2.

The lead electrodes 3 project from a side surface of the package 4 in the shape of gull wings. The lead electrodes 3 lead electric input or output of the bare chip 2 provided in the package 4 to a wiring board not shown in FIG. 1.

In the package 4, the electrode pad 1 formed on the surface of the bare chip 2 and end parts of the lead electrodes are connected by a wire 5 made of gold. This connection is made by a well-known wire bonding method. In the QFP having the above-discussed structure, the lead electrodes 3 project in the gull wing shape outside of the package 4 and extend straight toward the bare chip 2 inside of the package 4, so that most of a mounting area on the wiring board not shown in FIG. 1 is occupied by the lead electrodes 3.

In the electronic circuit board shown in FIG. 2, the bare chip 2 is mounted on a wiring board 100, not in a package where the bare chip 2 is sealed by a resin material, but unsealed. More specifically, plural electrode pads 1 on the bare chip 2 mounted on the wiring board 100 are connected to plural electrodes 101 formed on the wiring board 100 by a wire bonding method. Since lead electrodes used in the QFP shown in FIG. 1 are not necessary by such a wire connection, it is possible to make the mounting area small. The package 4 made of the resin material sealing the bare chip 2 mounted on the wiring board 100 may be provided.

In the electronic circuit board shown in FIG. 3, while the bare chip 2 is mounted on the wiring board 100 unsealed by the resin material, the way of mounting the bare chip 2 in FIG. 3 is different from the way of mounting the bare chip 2 in FIG. 2.

More specifically, in the electronic circuit board shown in FIG. 2, the bare chip 2 is mounted on the wiring board 100 so that the electrode pad forming surface, namely a front surface of the bare chip 2, faces vertically upward. On the other hand, in the electronic circuit board shown in FIG. 3, the bare chip 2 is mounted on the wiring board 100 so that the front surface of the bare chip 2 faces vertically downward, namely in a face down flip chip state.

Such mounting of the bare chip 2 is done by a Surface Mount technology (SMT). In the SMT, first, a solder paste lump is printed on the electrode 101 of the wiring board 100 by a mask printing method. Next, a chip such as an IC chip or chip condenser is mounted on the wiring board 100 so that an electrode pad 1 formed on a lower surface of the chip part comes in contact with the printed solder paste lump. By applying a reflow process, solder particles in the solder paste lump are melted then made solid, so that the electrode 101 of the wiring board 100 and the electrode pad of the chip are connected by the solder 6. By such an SMT, in the electronic circuit board in FIG. 3 where the bare chip 2 is mounted as the flip chip, unlike the electronic circuit board shown in FIG. 2, the bare chip 2 is mounted on the wiring board without providing the wire used for the wired bonding. Under this structure, it is possible to make the mounting area smaller because the wire 5 is not provided to the outside of the bare chip 2.

As a result of the reflow process, a gap is formed between the lower surface of the bare chip 2 and the surface of the wiring board 100. Such a gap is filled with an underfill material 7.

A method for manufacturing the electronic circuit board shown in FIG. 3 is discussed in Japanese Laid-Open Patent Application Publications No. 2001-308268 and No. 2003-282630.

It is general practice for the electrode 101 of the wiring board 100 to have a structure where an Au surface layer is provided on the surface of a metal mother material such as copper by an electrolytic gold plating process. The reason why the Au surface layer is provided is as follows.

In other words, while it is general practice for copper, aluminum, or the like to be used as the metal mother material of the electrode 101 of the wiring board 100, these metal materials may be oxidized and therefore the surface of these metal materials may be covered with an oxide film.

Since the metal mother material covered with the oxide film repels the molten solder, it is difficult to implement good solder connections. In order to realize good solder connections, an oxide film removing process may be applied to an exposed metal mother material and then the solder connection may be immediately formed.

However, in this method, a great number of the wiring boards 100 so made cannot be kept. If the wiring board 100 is left in an exposed state, the metal mother material is easily oxidized so that unevenness of an electric property of the electrodes 101 is generated due to the difference in exposure terms and a stable quality cannot be kept.

On the other hand, if the wiring boards 100 so made are not to be kept and the manufacturing process of the wiring board 100 and the mounting process of the electronic part on the wiring board 100 after the manufacturing process are continuously implemented, manufacturing costs rise and are higher than those in a case where the wiring boards 100 so made are to be kept. Because of this, an Au surface layer formed on the surface of the metal mother material is adopted as the structure of the electrode 101. By coating the surface of the metal mother material with Au (gold), which is a metal material that is hardly oxidized, even if a great amount of the wiring boards 100 so made are as to be kept, it is possible to prevent the oxidation of the surface of the electrode 101 and keep a state where solder can be easily provided.

In the manufacturing methods of the electronic circuit board discussed in Japanese Laid-Open Patent Application Publications No. 2001-308268 and No. 2003-282630, the solder 6 connecting the bare chip 2 and the wiring board 100 may be fragile. More specifically, as discussed above, it is general practice for the electrode 101 of the wiring board 100 to have a structure where an Au surface layer is provided on the surface of a metal mother material by the electrolytic gold plating process.

On the other hand, recently and continuing, as the size of the bare chip 2 becomes smaller because of the improvements of chip manufacturing techniques, the size of the electrode pad 1 of the bare chip 2 also becomes smaller. In addition, the diameter of the electrodes formed on the wiring board becomes reduced from greater than 250 μm to less than 250 μm. In the printing process for printing the solder paste lump on the small sized electrode 101, it is necessary to make the thickness of the printing mask extremely thin so that the solder paste is taken out from a minute piercing hole forming the printing pattern of the printing mask. The thickness of the solder paste lump after the printing also becomes less. Thus, in a recent technique whereby the thickness of the solder paste lump is made thin, the amount per unit area of the solder 9 provided between the electrode 101 of the board 100 and the electrode pad 1 of the bare chip 2 is small. When the solder particles of the solder paste lump printed on the electrode 101 are melted by the reflow process, gold in the Au surface layer of the electrode 101 is educed into the molten solder. If the amount of the educed gold is too much, the solder 6 after being solidifying becomes extremely fragile. In recent techniques wherein the amount per unit area of the solder 9 is extremely small, the ratio of the educed amount of gold against the solder 6 is large so that the solder 6 may be extremely fragile.

An inventor of the present invention determined that the educed amount of gold against the solder 6 becomes smaller by reducing the thickness of the Au surface layer of the electrode 101. In an electrolytic plating process, since the thickness of the Au surface layer may be approximately 2 μm, it is not possible to prevent the solder 6 from becoming fragile. On other hand, in electroless plating, since the thickness of the Au surface layer may be approximately several hundreds nm, it is possible to sufficiently prevent the solder 6 from becoming fragile.

The inventor of the present invention tried to manufacture the electrode 101 having the Au surface layer by the electroless plating process. However, the solder 6 could not be connected to the electrode 101 very well. This is because a large number of minute invisible holes are formed in the extremely thin Au surface layer and the metal material under the Au surface layer is exposed through the holes so that an oxide film is formed.

Next, the inventor of the present invention manufactured a wiring board 100 where a surface of the electrode 101 not having the Au surface layer is covered by a film of flux made of a material different from Au so that oxidation prevention film is formed on the electrode 101. After such a wiring board 100 was left for a designated time, the bare chip (flip chip) 2 was mounted on the wiring board 100 by the SMT. As a result of this, the bare chip 2 could be connected to the wiring board 10 very well without repelling the molten solder on the electrode 101. In addition, sufficient strength could be obtained using the solid solder 6. Hence, by covering the surface of the electrode 101 not having the Au surface layer with the film of flux, which flux is a non-metal material, it is possible to so make and keep a large number of the wiring boards 100. Therefore, low cost manufacturing can be achieved and sufficient strength of the solder 6 can be obtained.

However, in such a wiring board 100, some of the plural electrodes 101 formed on the wiring board 100 cannot work well as contact electrodes. More specifically, in recent electronic apparatuses, not all of the plural electrodes 101 on the wiring board 100 work as electrodes for solder connection but some of electrodes 101 work as contact electrodes. Here, the contact electrode works as an electric contact between an electric apparatus main body and an electronic device detachable from the electronic apparatus main body. For example, a home television game machine may have a structure where a ROM cassette in which game software is stored can be detached from a game machine main body. Under this structure, a contact electrode for connecting the game machine main body and the ROM cassette is necessary. Because of this, a home television game machine, having a structure where the contact electrode provided on the electronic circuit board of the ROM cassette is slid on the contact electrode at the game machine main body side as accompanying attachment or detachment of the cassette so that both contact electrodes are connected, has been widely sold.

In addition, for a portable phone having a structure where a battery unit as an electronic device is attached or detached against a phone main body, it is general practice for the phone main body and the battery unit to be connected by similar contact electrodes. Surfaces of these contact electrodes are not covered with solder so as to be exposed.

Because of this, it is preferable that an Au surface layer be provided so that the reduction of the conductivity due to the progress of the oxidation can be prevented. In addition, in a case where the contact electrodes are slid and come in contact with each other as accompanying attachment and detachment of the electronic device, the Au surface layer works effectively. Since gold (Au) is a metal material having a relatively small coefficient of sliding friction, hanging of the contact electrodes at the time of sliding and making contact can be prevented so that a smooth attachment or detachment can be done.

On the other hand, recently, the processing speed of bare chip 2 has become higher due to the improvement of chip manufacturing techniques. For accompanying the high speed, it is desirable that the signal transmission speed between the bare chip 2 and other electronic parts becomes high or that noise mixture is reduced.

However, there is no discussion about a technique whereby the signal transmission speed between electronic parts can be made high and noise mixture can be reduced, in Japanese Laid-Open Patent Application Publications No. 2001-308268 or No. 2003-282630.

In the manufacturing method of the electronic circuit board discussed in Japanese Laid-Open Patent Application Publications No. 2001-308268 and No. 2003-282630, depending on the structure of the bare chip 2, the underfill process may be difficult. This is because, as shown in FIG. 4, plural electrode pads 1 are concentrated on a circumference edge part of the electrode forming surface of the bare chip 2 so that the electrode 1 is not provided in the center of the electrode forming surface.

In the underfill process of the bare chip 2, as shown by an arrow in FIG. 5, an underfill material is caused to flow from an opening formed in the plural solders 6 connecting the bare chip 2 and the wiring board 100 so that the underfill material is made to go right below the chip center part by capillary action. However, if this opening is too small, sufficient capillary action cannot be obtained and therefore the underfill process may be difficult.

SUMMARY

In an aspect of this disclosure, there is provided a wiring board whereby fragility of solder due to a great amount of gold formed on an electrode surface of the wiring board in the solder can be avoided and a part of plural electrodes can work well as a contact electrode.

In another aspect of this disclosure, there is provided a wiring board manufactured ar low cost by being so made as to be kept.

In another aspect of this disclosure, there is provided an electronic circuit board and a manufacturing method of the electronic circuit board, whereby in the electronic circuit board signal transmission speed between electronic pant can be made high and noise mixture can be reduced.

In another aspect of this disclosure, there is provided an electronic circuit board and a manufacturing method of the electronic circuit board, whereby an underfill process of a small size electronic part can be easily done.

The above-mentioned object of the present invention is achieved by, for example In an exemplary embodiment, there is provided a wiring board including:

a substrate made of an insulation material and wired by a conductive material;

wherein a plurality of electrodes is formed on a surface of the substrate; and a non-Au electrode not having an Au surface layer and an Au electrode having the Au surface layer are formed as the electrodes.

DETAILED DESCRIPTION OF THE PREFERRED EMBODIMENTS

A description of the present invention and details of drawbacks of the related art are now given, with reference to FIG. 6 through FIG. 24, including embodiments of the present invention.

More specifically, embodiments of a Printed Wiring Board (PWB) as a wiring board of the present invention, a module board as an electronic circuit board of the present invention, and a manufacturing method of the electronic circuit board are discussed.

First, the embodiment of the Printed Wiring Board (PWB) as the wiring board of the present invention is discussed.

Figure 6:
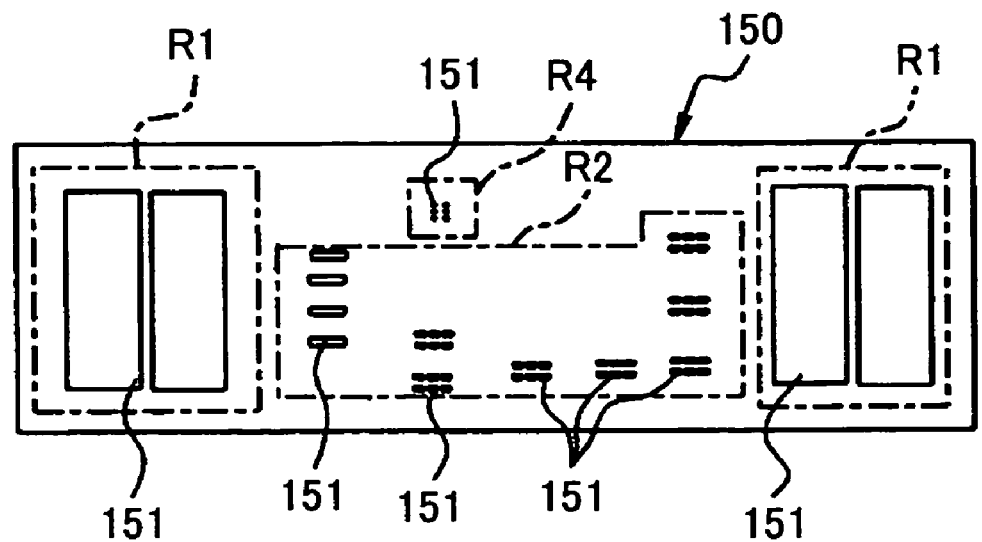
FIG. 6 is a plan view seen from a first surface side of a Printed Wiring Board (PWB) of an embodiment of the present invention.

FIG. 6 is a plan view seen from a first surface side of a Printed Wiring Board (PWB) 150.

An electrode pattern of plural non-Au electrodes 151 is formed on a first surface of the PWB 150 by a well-known technique. The first surface includes an electrode block mounting area R1, Surface Mount Device (SMD) mounting area R2, and a flip chip mounting area R3.

The electrode block mounting area R1 is where an electrode block discussed later are mounted. The non-Au electrodes 151 of the electrode pattern in this area have rectangular shaped-configurations and big sizes whose length is approximately 10 mm.

The SMD mounting area R2 is where an electronic part such as a chip condenser different from a bare chip is surface-mounted. The non-Au electrodes 151 of the electrode pattern in this area have small size plan areas equal to or greater than 0.049 mm$^2$.

The flip chip mounting area R3 is where a bare chip is surface-mounted as a flip chip. The non-Au electrodes 151 of the electrode pattern in this area have extremely small size plan areas equal to or smaller than 0.049 mm$^2$.

Figure 7:
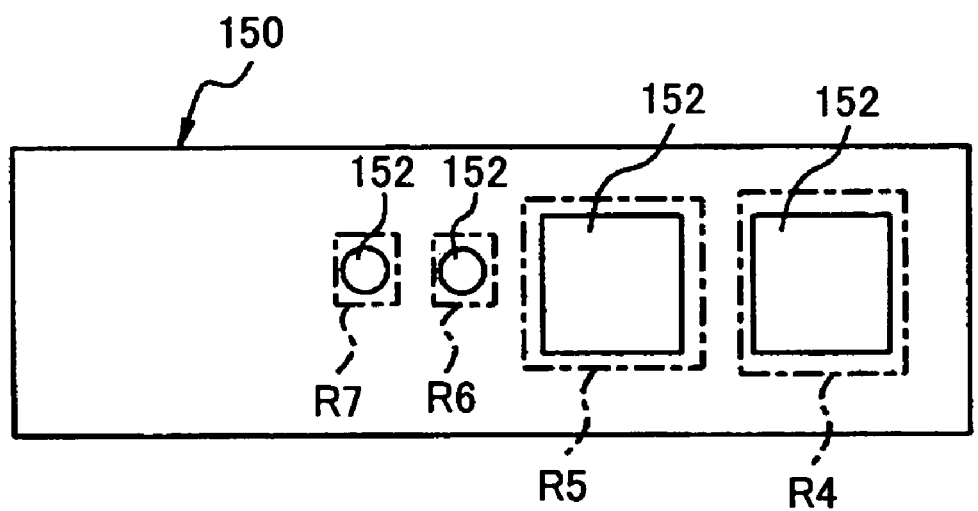
FIG. 7 is a plan view seen from a second surface side of the Printed Wiring Board (PWB) of the embodiment of the present invention.

FIG. 7 is a plan view seen from a second surface side of the Printed Wiring Board (PWB) 150.

An electrode pattern of plural non-Au electrodes 151 is formed on a second surface of the PWB 150 by a well-known technique. The second surface includes a negative contact electrode forming area R4, a positive contact electrode forming area R5, a negative test electrode forming area R6, and a positive test electrode forming area R7.

In the negative contact electrode forming area R4, a single large size Au electrode 152 having a rectangular shaped plane configuration is formed and works as a negative contact electrode.

In the positive contact electrode forming area R5, a single large size Au electrode 152 having a rectangular shaped plane configuration is formed and works as a positive contact electrode.

In the negative test electrode forming area R6, a single middle size Au electrode 152 having a circular shaped plane configuration is formed and works as a negative test electrode.

In the positive test electrode forming area R7, a single middle size Au electrode 152 having a circular shaped plane configuration is formed and works as a positive test electrode.

Figure 8:
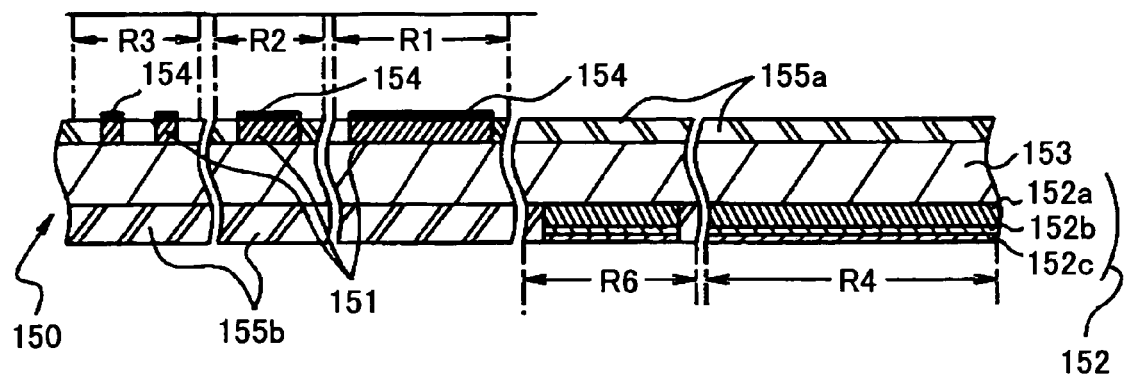
FIG. 8 is a partially expanded cross-sectional view of the Printed Wiring Board (PWB) of the embodiment of the present invention.

FIG. 8 is a partially expanded cross-sectional view of the PWB 150 of the embodiment of the present invention. In FIG. 8, an upper surface is indicated as a first surface and a lower surface is indicated as a second surface.

The PWB 150 includes the non-Au electrodes 151, the Au electrodes 152, a substrate 153 made of glass-epoxy insulation material, an oxidation prevention film 154, a resist film 155, and others.

Plural non-Au electrodes 151 formed on the first surface of the PWB 150 have single layer structures made of only copper as a metal mother material. While illustration is omitted in FIG. 8 for convenience of explanation, the surface of the non-Au electrode 151 is covered with the oxidation prevention film 154 formed by a flux made of a material different from gold (Au). The thickness of the non-Au electrode 151 is approximately 35 μm.

A first resist layer 155a is provided on a substrate area where the non-Au electrodes 151 are not formed in the first surface of the PWB 150. The surface of the non-Au electrodes 151 is situated at the same height as the surface of the first resist layer 155a. The first resist layer 155a is formed on the first surface of the substrate 153 in a non-Au electrode forming process by a well-known photolithography method.

A material other than flux may be used in forming the oxidation prevention film 154. However, the material has to be different from gold (Au). This is because the solder may become fragile if gold (Au) is used as the material forming the oxidation prevention film 154. In addition, in a case where the fragility of the solder due to educed metal material other than gold (Au) may be a problem, the oxidation prevention film 154 may be made of a non-metal material. Flux is a material different from gold (Au) and a non-metal material.

As the flux, a well-known material whose main ingredient is rosin can be used. The rosin is a main ingredient forming the flux and is made of aliphatic carboxylic acid such as abietic acid. The rosin prevents the oxidation of the electrode surface so that good wetting of the molten solder against the electrode surface can be obtained. A material where another material improving an oxide removing action such as aliphatic amine halogenated hydroacid salt like diethylamine hydrochloride, or cyclohexylamine hydrobromide or aliphatic carboxylic acid like succinic acid or malonic acid is added may be used, other than rosin. In addition, instead of rosin, various kinds of non-metal organic materials or non-metal inorganic materials are used as the main ingredient of the flux. While the flux is formed by liquifying the rosin or the like in a solvent such as alcohol, the solvent evaporates so that the solid state oxidation prevention film 154 remains after the flux is applied to the surface of the non-Au electrode 151. When the flux is applied to the entire first surface of the PWB 150, the flux on the first resist layer 155a is repelled so as to gather on the surface of the non-Au electrodes 151. Thus, the oxidation prevention film 154 is formed on almost only the surface of the non-Au electrodes 151 by applying the flux to the entire first surface of the PWB 150.

The non-Au electrodes 151 formed in the flip chip mounting area R3 of the first surface of the substrate 153 have a rectangular-shaped plan area of 100 μm by 100 μm.

The Au electrodes formed on the second surface of the PWB 150 include a mother material layer 152a, an intermediate layer 152b, and an Au surface layer 152c.

The mother material layer 152a is made of copper being a metal mother material. The intermediate layer 152b made of nickel (Ni) is provided on the mother material layer 152a. The Au surface layer 152c made of gold (Au) is provided on the intermediate layer 152b. The intermediate layer 152b is provided on the mother material layer 152a by a well-known nickel plating process. Via the intermediate layer 152b, the Au surface layer 152c is fixed to the mother material layer 152a made of copper (Cu) to which gold may not be fixed. The Au surface layer 152c is provided on the intermediate layer 152b by a well-known electrolytic gold plating process. The thicknesses of the intermediate layer 152b and the Au surface layer 152c are several μm.

A second resist layer 155b is provided on a substrate area where the Au electrodes 152 are not formed in the second surface of the PWB 150. The surface of the Au electrodes 152 is situated at the same height as the surface of the second resist layer 155b. The second resist layer 155b is formed on the second surface of the substrate 153 in a non-Au electrode forming process by a well-known photolithography method.

In the PWB 150 having the above-discussed structure, the non-Au electrode 151 not having the Au surface layer and the Au electrodes 152 having the Au surface layer 152c are formed as electrodes on the substrate 153 made of glass-epoxy, an insulation material. In addition, the oxidation prevention film 154 made of flux, a non-metal material, is formed on the surface of the non-Au electrodes 151.

Under this structure, oxidation of the surface of the non-Au electrodes 151, where the Au surface layer is not provided, is prevented by the oxidation prevention film 154 made of the flux so that the surface of the non-Au electrodes 151 keeps, for a long period of time, a state where solder can be successfully provided.

As a result of this, it is possible to so make and keep a large number of the PWBs 150 so that manufacturing cost of the electronic circuit board can be reduced. In addition, when a small size electronic part such as a bare chip is soldered to the non-Au electrode 151, even if the amount of the solder provided between the electrode pad of the small size electronic part and the non-Au electrode 151 has to be minute because the size of the electrode pad is extremely small, no gold is disposed from the non-Au electrode 151 to the solder. Therefore, it is possible to avoid the fragility of the solder due to a large amount of educed gold of the electrode surface in the solder. In addition, since the Au electrode 152 having the Au surface layer 152c, other than the non-Au electrodes 151, is formed, the oxidation of the mother material layer 152a is prevented so that the mother material layer 152a can work well as the contact electrode such as a slide type contact electrode.

Furthermore, in the PWB 150 of the embodiment of the present invention, plural electrodes are formed on both surfaces of the substrate 153. All of plural electrodes formed on the first surface of the substrate are the non-Au electrodes 151. All of plural electrodes formed on the second surface of the substrate are the Au electrodes 152.

Under this structure, it is possible to simplify the electrode forming process so that manufacturing cost can be reduced, as compared with a case where different kinds of electrodes such as the non-Au electrode and the Au electrode are formed and mixed on the same surface of the substrate 153.

In addition, in the PWB 150 of the embodiment of the present invention, plan areas of the non-Au electrodes 151 formed in at least the flip chip mounting area R3 are less than 0.049 mm² and all of the Au electrodes 152 have plan areas equal to or greater than 0.049 mm². By making the plan areas of the non-Au electrodes 151 formed in the flip chip mounting area R3 less than 0.049 mm², it can be used for mounting a small size flip chip. Hence, it is possible to surface-mount a recent small size bare chip as a flip chip on the first surface of the substrate 153. By making all of the Au electrodes 152 having the plan areas equal to or greater than 0.049 mm², oxidation of all of the electrodes formed on the second surface of the substrate 153 can be prevented by the Au surface layer 152c.

Figure 9:
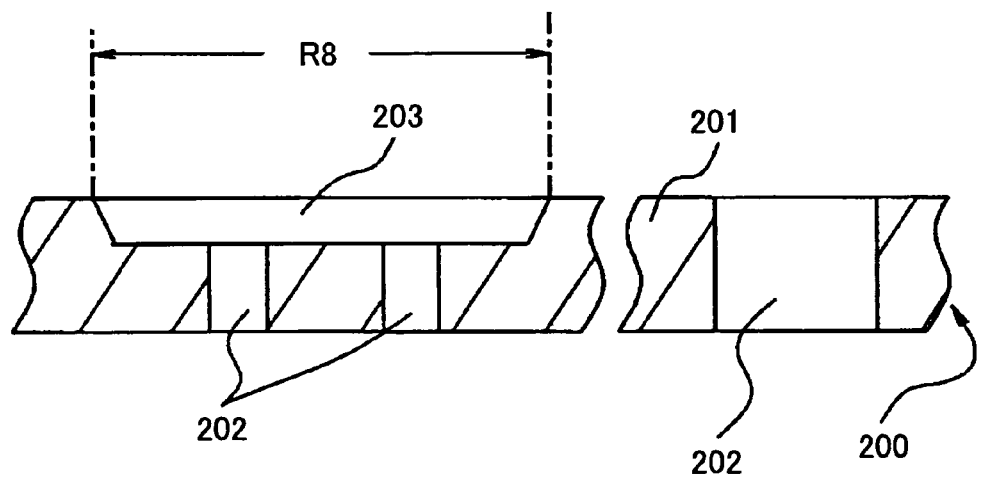
FIG. 9 is a partially expanded cross-sectional view of a plastic mask used in a manufacturing method of an electronic circuit board of an embodiment of the present invention.

FIG. 9 is a partially expanded cross-sectional view of a plastic mask used as a printing mask when surface mounting by the STM on the PWB 150 of the embodiment of the present invention is implemented.

The plastic printing mask is formed by a printing pattern of plural piercing holes 202 in a plastic plate made of a material such as polyethylene terephthalate (PET) by an excimer laser process. This printing pattern corresponds to the electrode pattern formed on the first surface of the PWB 150 of the embodiment of the present invention.

An area shown by "R8" in FIG. 9 in the entire area in a surface direction of the plastic mask 200 is a half etching part 203 that is more recessed than other areas. This recess is also formed by the excimer laser process. The plastic plate 201 has a thickness of 75 μm. Cutting by the excimer laser process is done so that the half etching part 203 has a depth of 25 μm.

The area show by "R8" in FIG. 9 where the half etching part 203 is formed corresponds to the flip chip mounting area R3 in the first surface of the PWB 150 shown in FIG. 6. Via plural piercing holes 202 formed in the half etching part 203 of the plastic mask 200, minute solder paste lumps are printed on plural flip chip non-Au electrodes 151 formed in the flip chip mounting area R3 of the PWB 150.

As shown in FIG. 9, diameters of plural piercing holes 202 formed in the half etching part 203 are extremely smaller than diameters of plural piercing holes 202 formed outside the half etching part 203. This is because the size of the electrode pads of the flip chip is extremely small. By reducing the length of the piercing holes 202 having the small diameter by forming the half etching part 203, the solder paste can be suitably taken out from the holes 202. The piercing holes 202 formed by the excimer laser process have good internal wall smoothness by cutting based on an ablation phenomenon so as to improve the ability for taking out the solder, as compared with the piercing holes formed in a metal mask.

Figure 10:
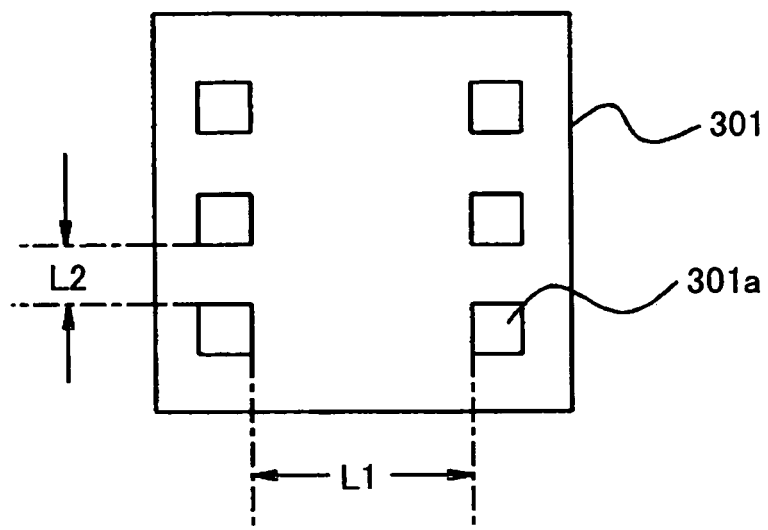
FIG. 10 is a plan view of an electrode forming surface of a flip chip mounted on a module board manufactured by the manufacturing method of the electronic circuit board of the embodiment of the present invention.

FIG. 10 is a plan view of an electrode forming surface of a flip chip 301.

Figure 1:
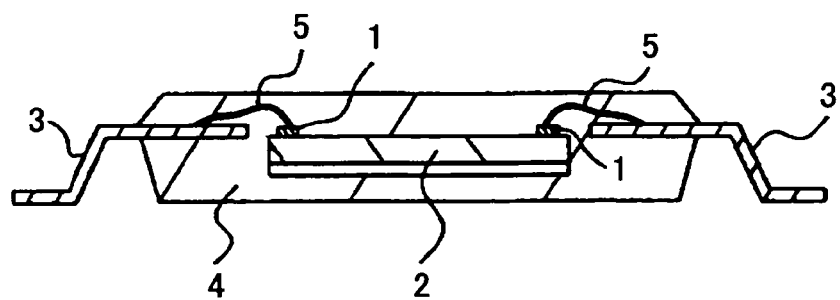
FIG. 1 is a schematic structural view of a related art Quad Flat Package (QFP) as an IC chip.
Figure 2:
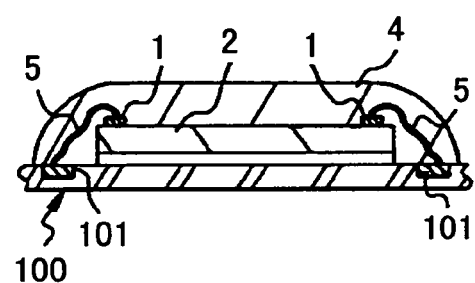
FIG. 2 is a schematic structural view of a related art electronic circuit board manufactured by an old type Chip On Board (COB) process.
Figure 3:
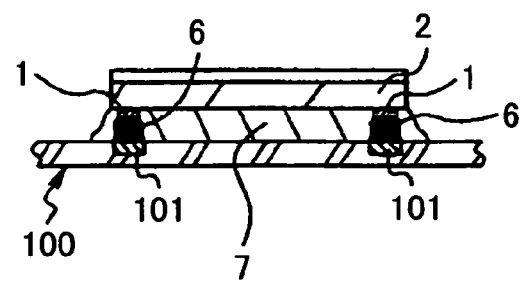
FIG. 3 is a schematic structural view of a related art electronic circuit board manufactured by a new type Chip On Board (COB) process.
Figure 4:
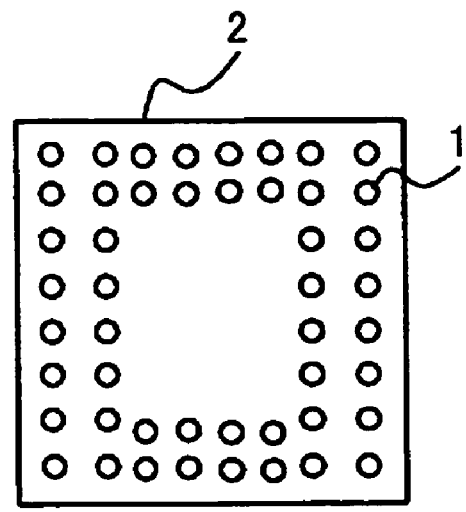
FIG. 4 is a plan view showing an electrode forming surface of a bare chip mounted on the electronic circuit board.
Figure 5:
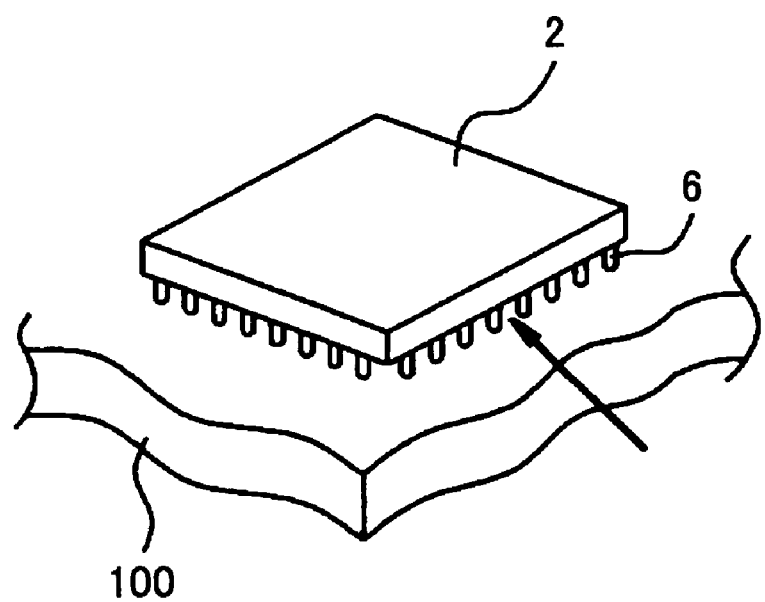
FIG. 5 is an expanded perspective view of the electronic circuit board.

As shown in FIG. 10, six electrode pads 301a are formed at a periphery edge part of the electrode forming surface. More specifically, two electrode lines formed by three contact electrode pads 301a are provided at two edge parts facing each other among four edge parts corresponding to four sides of the rectangular-shaped electrode forming surface. Electrode pads 301a are provided at end parts of the electrode lines. Length L1 between the electrode pads 301a is equal to or greater than 500 μm. On the other hand, length L2 between the electrode pads neighboring in the electrode line is less than 500 μm. A plan area of the electrode pad 301a is equal to or greater than 100 μm×100 μm=0.01 mm². This is the smallest among the electrode pads of plural electronic parts mounted on the above-discussed PWB 150. As shown in FIG. 5, in a case where plural electrode lines are provided at the periphery edge parts, it is necessary for the distance between the electrode lines facing each other situated at a center side to be equal to or greater than 500 μm.

Figure 11:
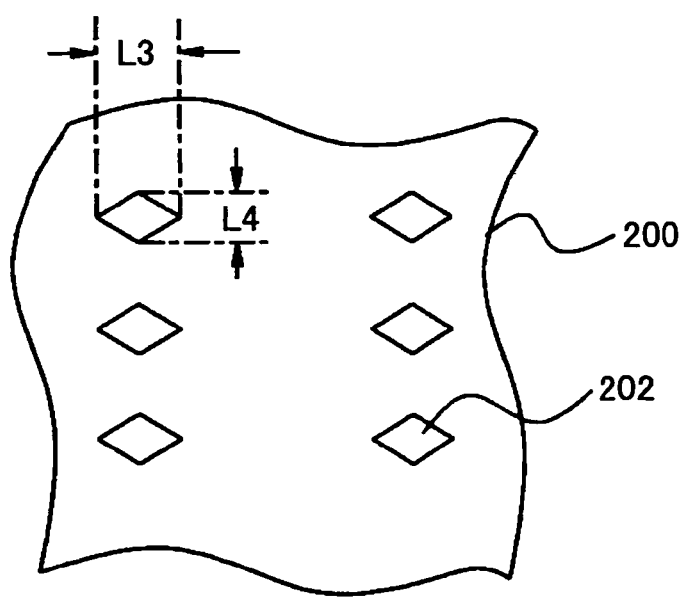
FIG. 11 is an expanded plan view of a half etching part of the plastic mask.

FIG. 11 is an expanded plan view of the area R8 of the plastic mask 200.

It is general practice to form the piercing hole in the printing mask where the opening of the piercing hole has a circular shaped-configuration. However, in a case of the piercing hole having a minute diameter corresponding to the extremely small electrode like the electrode pad 301a of the flip chip 301 shown in FIG. 10, if the opening has a circular shaped-configuration, it is difficult to supply the solder paste squeezed in the printing process into the piercing hole. The inventor of the present invention found that solder paste can be supplied into the piercing hole by, as shown in FIG. 11, making the openings of the minute piercing holes have a diamond shaped-configuration and making a sharp edge of the diamond shaped-configuration face in a solder squeezing direction, namely the direction shown by an arrow in FIG. 11. Hence, in the manufacturing method of the electronic circuit substrate of the embodiment of the present invention, the plastic mask 200 having a structure where the piercing hole in the area R8 (in the half etching part) is formed like this, is used. The length L3 in a longitudinal direction in the diamond shaped opening is 130 μm and the length L4 in a short direction in the diamond shaped opening is 100 μm.

FIG. 12 through FIG. 16 are views showing processes of the manufacturing method of the electronic circuit board for obtaining a module board as the electronic circuit board by mounting the electronic part on the PWB 150 of the embodiment of the present invention. In FIG. 12 through FIG. 16, the numerical reference 302 indicates the SMD as the electronic part and the numerical reference 301 represents the flip chip.

Figure 12:
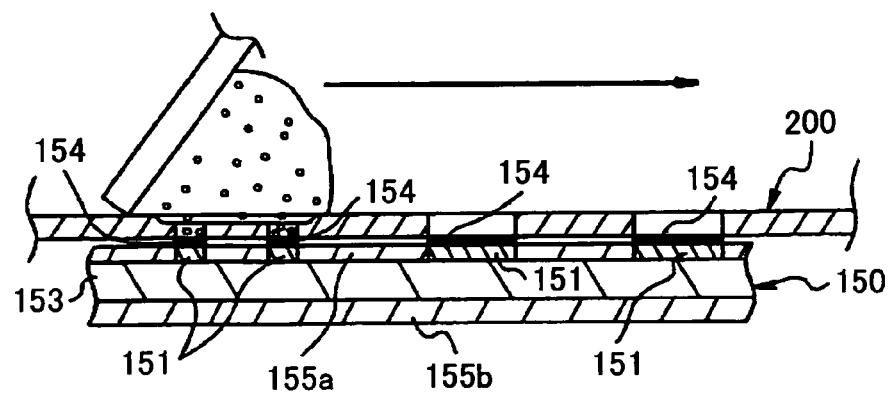
FIG. 12 is a cross-sectional view showing a paste process implemented in a printing process of the manufacturing method of the electronic circuit board of the embodiment of the present invention.
Figure 13:
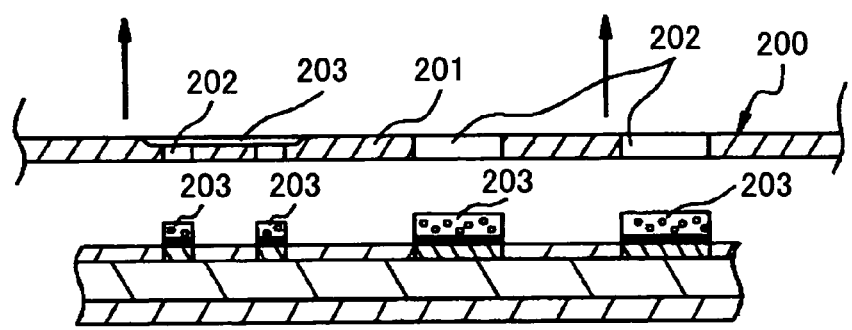
FIG. 13 is a cross-sectional view showing a mask removing process implemented in the printing process of the manufacturing method of the electronic circuit board of the embodiment of the present invention.

In the manufacturing method of the electronic circuit board, as shown in FIG. 12 and FIG. 13, the solder paste lumps 203 are printed on the non-Au electrodes 151 of the first surface of the PWB 150 by using the plastic mask 200 (printing process).

Figure 14:
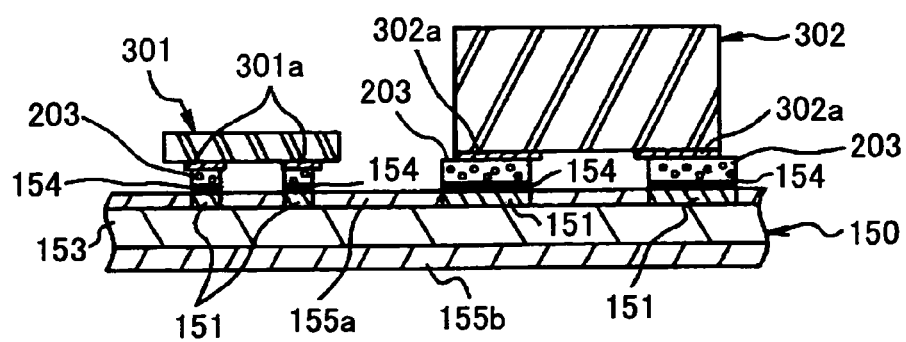
FIG. 14 is a cross-sectional view showing a mounting process of the manufacturing method of the electronic circuit board of the embodiment of the present invention.

Next, as shown in FIG. 14, the electronic parts 301 and 302 or a nickel block (not shown in FIG. 14) are mounted on the PWB 150 where the solder paste printing has been done, by using a well-known chip mounter (mounting process).

Figure 15:
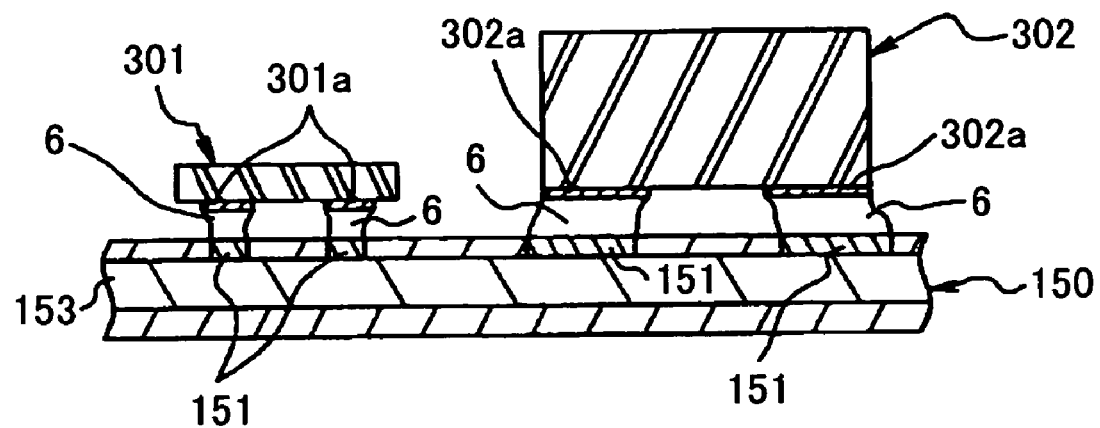
FIG. 15 is a cross-sectional view showing a reflow process of the manufacturing method of the electronic circuit board of the embodiment of the present invention.

As shown in FIG. 15, solder particles (not shown) in the solder paste lumps 203 are melted by increasing the temperature of the PWB 150 in the reflow furnace, so that electrodes pads 301a and 302a of the various electronic parts and the electrode block are soldered to the non-Au electrodes 151 of the first surface of the PWB 150 (connecting process).

Figure 20:
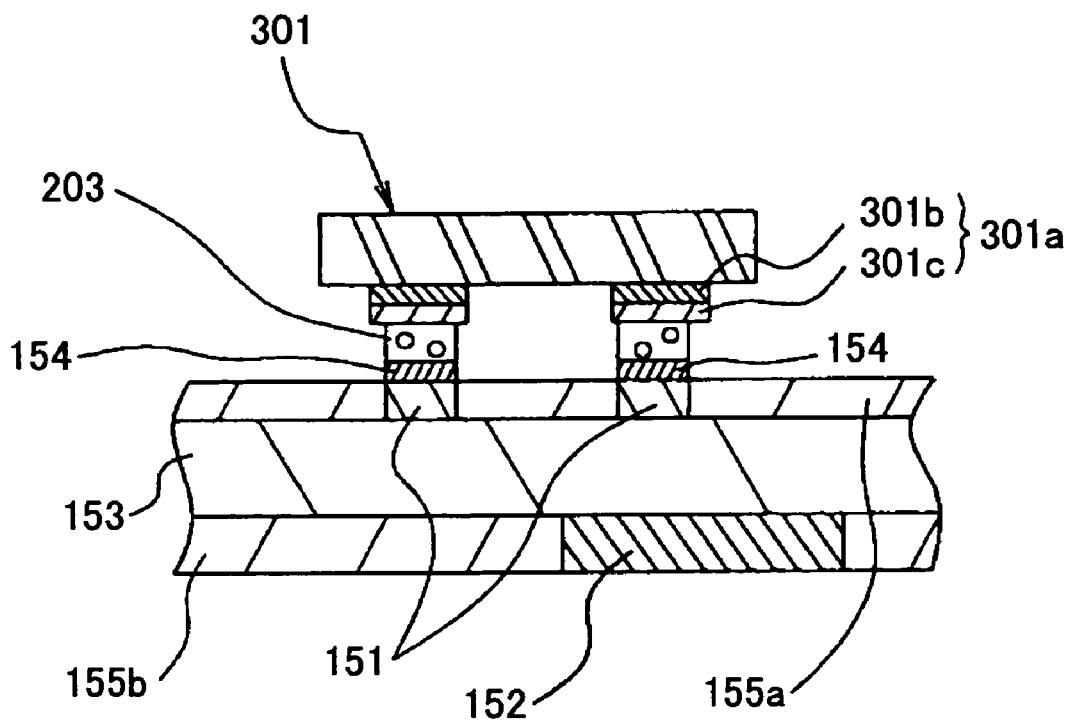
FIG. 20 is an expanded cross-sectional view showing a flip chip mounted on the PWB by the manufacturing method of the electronic circuit board of the embodiment of the present invention.

FIG. 20 is an expanded cross-sectional view showing a flip chip 301 mounted on the PWB 150 by the manufacturing method of the electronic circuit board of the embodiment of the present invention. The flip chip 301 is mounted on the first surface of the PWB 150 where the non-Au electrodes 151 are formed. The oxidation prevention films 154 over the surfaces of the non-Au electrodes 151 provided on the first surface of the PWB 150.

While the solder paste lumps 203 are printed on the oxidation prevention film 154 in the printing process, the flip chip 301 is mounted on the first surface so that the electrode pads 301a as the contact electrodes overlap the solder paste lumps 203. The electrode pads 301a as the contact electrodes of the flip chip 301 are formed by a flat metal mother material pad 301b made of a non-Au material such as nickel or aluminum or a Au surface layer 301c made of gold and covered with the metal mother material pad 301b.

A projection such as a gold bump (See FIG. 21) formed on the contact electrode of the flip chip used in general conventionally is not formed on the Au surface 301c. The Au surface layer has a flat configuration as shown in FIG. 20. An area of the Au surface facing upward in FIG. 21 and connecting to the substrate electrode is slightly greater than an area of a side surface in a thickness direction of the Au surface layer.

By mounting the flip chip 301 having the Au surface layer 301c on the first surface of the PWB 150, as shown in FIG. 20, the AU surface layer 301c comes in contact with only the surface of the solder paste lump 203.

Figure 24:
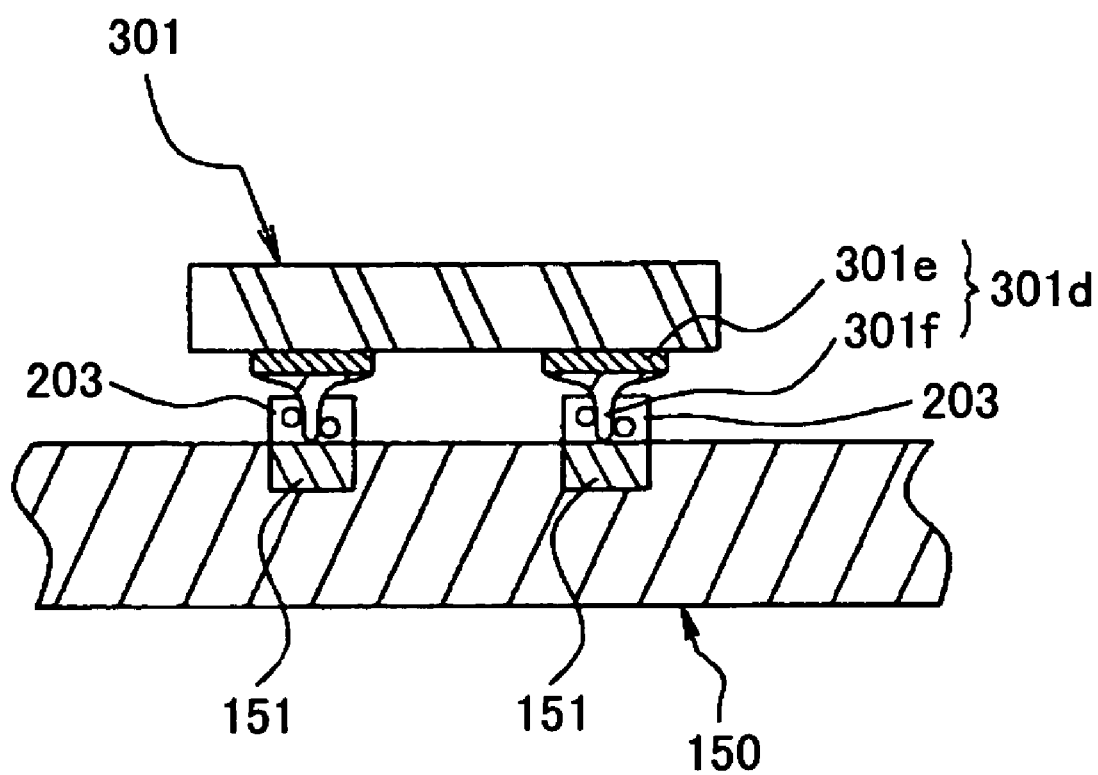
FIG. 24 is an expanded cross-sectional view showing the related art flip chip mounted on the PWB.

By applying the reflow process in this state, the amount of educed gold in the molten solder can be reduced, as compared with a case where the reflow process is applied in a state where the gold bump 301f shown in FIG. 24 is taken into the solder paste lump 203. As a result of this, it is possible to prevent fragility of the solder connection due to educed gold used for the contact electrode of the flip chip in the molten solder.

In a case where the Au surface layer 301c is formed in a flat shape as shown in FIG. 20, the solder paste lump 203 is pushed and crushed when the flip chip 301 is mounted on the PWB 150 by the mounter so that a necessary gap may not be secured between the lower surface of the chip and the substrate surface. However, the inventor of the present invention found that the crushing of the solder paste lump 203 may be avoided by making the speed of an arm where the chip is held at its head end of the mounter slow just before the flip chip 301 comes in contact with the solder paste lump 203.

Figure 16:
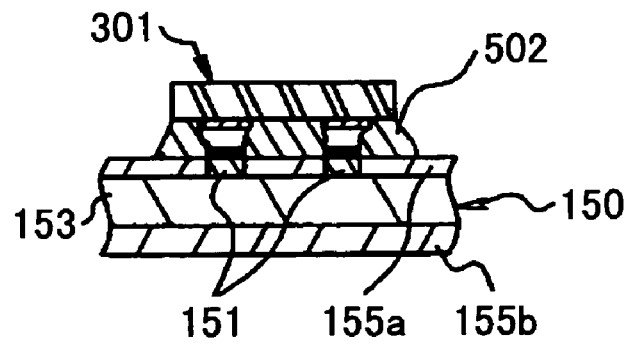
FIG. 16 is a cross-sectional view showing an underfill process of the manufacturing method of the electronic circuit board of the embodiment of the present invention.

After the connection process by the reflow is applied, as shown in FIG. 16, an underfill process is applied so that the underfill material 502 is supplied in a gap between the electrode forming surface of the flip chip 301 and the part mounting surface of the wiring board 150.

The inventor of the present invention found that, through the actual above-mentioned processes, the height of the gap after the reflow process is applied is approximately 50 through 60 µm, being less than 70 µm. The cleaning process prior to the under fill process is not implemented. The reason why the cleaning process is not necessary is as discussed above. By the above-mentioned processes, the module board 210 as the electronic circuit board where the electronic parts are mounted on the PWB 150 is manufactured.

It is preferable to used a lead-free solder paste whose solder particles have a diameter of 10 through 30 µm. The smaller the average particle diameter of the solder paste, the better is the solder paste connection ability.

Figure 17:
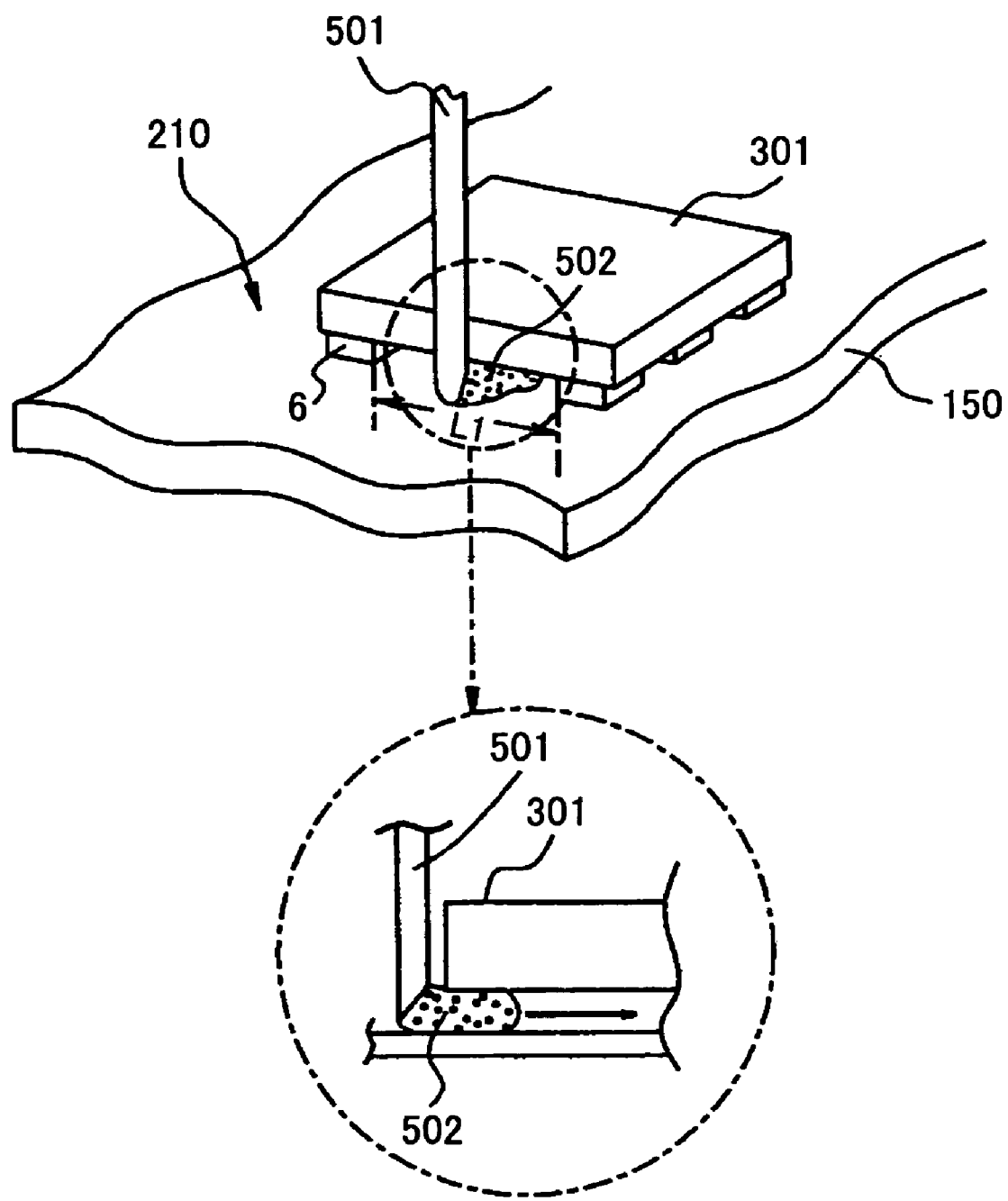
FIG. 17 is a perspective view showing the underfill process of the manufacturing method of the electronic circuit board of the embodiment of the present invention.

In the underfill process, as shown in FIG. 17, the underfill material 502 flows in a side surface whose distance between the electrode pads 301a is equal to or greater than 500 µm among four side surfaces of the flip chip 301.

While an obliquely cut inclination part at a head end of a nozzle 501 faces the gap between the first surface of the module board 210 and the flip chip 301, the underfill material 502 jetted from the inclination part may come in contact with both the flip chip 301 and the module board 210. As a result of this, because of capillary action, it is possible to make the underfill material 502 spread evenly throughout the depth of the gap. The underfill material 502 becomes solid based on evaporation of the solvent.

In the module board 210 as the electronic circuit board, since the flip chip is surface mounted by the SMT, it is possible to drastically reduce impedance between the flip chip and the substrate electrode as compared with a case where the flip chip and the substrate electrode are connected by wire bonding. For example, while the impedance in the case of the wire bonding is 30 mΩ, the impedance in this embodiment is 15 mΩ. Because of this, it is possible to manufacture the module board 210 strong against noise and proper for high speed processing.

In addition, the thickness of the solder connecting each of the flip chip 301 and the non-Au electrode 151 of the wiring board 150 is equal to or less than 70 µm. Hence, as a compared with a case where the thickness of the solder connecting each of the flip chip 301 and the non-Au electrode 151 of the wiring board 150 is equal to or greater than 100 µm, it is possible to make signal transmission speed high and reduce mixture of the noise. In addition, it is possible to easily implement the underfill process of the flip chip 301 by flowing in the underfill material 502 from the opening whose distance L1 between the electrode pads 301a, namely between the solders, is equal to or greater than 500 µm.

It is also possible to make a package by sealing the periphery of the flip chip 301 by resin. In a case where plural flip chips 301 are mounted on the PWB 150, after the sealing resin flows in plural concave parts of a mold member corresponding to the flip chips 301, the resin in the mold contacts the first surface and is separated from the mold so that the sealing process can be applied at the same time to plural flip chips. While acrylic resin, epoxy resin, silicon resin and other can be used as the sealing resin, the epoxy resin is most preferable.

Figure 18:
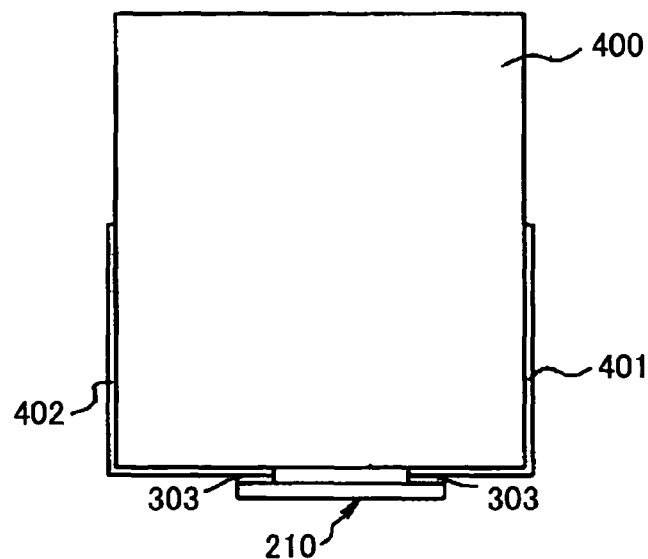
FIG. 18 is a plan view for explaining a process for fixing the module board manufactured by the manufacturing method of the electronic circuit board of the embodiment of the present invention to a lithium battery.

The module board 210 manufactured by the above-discussed processes can be used as a battery protection module of a mobile phone as an electronic apparatus, for example. More specifically, the module board 210 can be used as a module for preventing an excess current from flowing in a lithium battery at the time of charging the lithium battery pack of the mobile phone. In this case, as shown in FIG. 18, one of the two electrode blocks 303 mounted on the first surface is welded to a positive metal ribbon 401 extending from inside of the lithium battery 400. Furthermore, the remaining of the two electrode blocks 303 is welded to a positive metal ribbon 402 extending from inside of the lithium battery 400. Under this structure, the Au electrode 152 having a rectangular shaped-configuration and formed in the negative contact electrode forming area R4 in the second surface of the substrate shown in FIG. 7 is electrically connected to the negative electrode of the lithium battery 400 and works as a negative contact electrode. Furthermore, the Au electrode 152 having a rectangular shaped-configuration and formed in the negative contact electrode forming area R5 is electrically connected to the positive electrode of the lithium battery 400 and works as a positive contact electrode. In addition, the Au electrode 152 having a circular shaped-configuration and formed in the negative contact electrode forming area R6 is electrically connected to the negative electrode of the lithium battery 400 and works as a negative contact electrode. Furthermore, the Au electrode 152 having a circular shaped-configuration and formed in the negative contact electrode forming area R7 electrically connects to the positive electrode of the lithium battery 400 and works as a positive contact electrode. The negative test electrode or the positive test electrode is used for inspecting the lithium battery pack.

Figure 19:
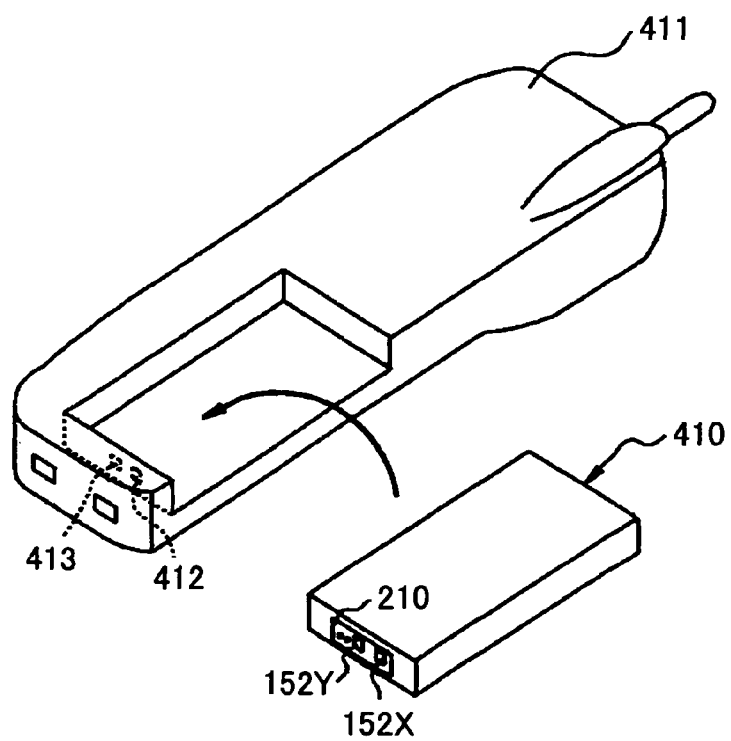
FIG. 19 is a perspective view showing a lithium battery pack where the lithium battery and the module board are provided and a main body of a portable phone.

A battery pack 410 having the above-discussed lithium battery 400, the module board 210, and others is attached or detached against the phone main body 411 of the mobile phone, as shown in FIG. 19. When the battery pack 410 is attached or detached against the phone main body 411 of the mobile phone, the negative contact electrode 152Y or the positive contact electrode 152Y are slid and moved on the negative electrode 412 or the positive electrode 413 of the phone main body 411 of the mobile phone so that the battery pack 410 is connected to the negative electrode 412 or the positive electrode 413.

Although the example of manufacturing the battery protection module where the flip chip works as an analog type integrated circuit by using the PWB of the embodiment of the present invention is discussed, the present invention is not limited to this. For example, it is possible to manufacture an electric power protection circuit for an electronic apparatus such as an analog type Radio Frequency Identification (RFID) device, DC/DC converter, or game machine. It is also possible to manufacture an image processing module at an image forming apparatus, a digital type RAM module, or a CPU module. The analog type or digital type module can be used for a mother board of a personal computer, a hard disk drive (HDD), a car navigation system, a DVD drive, a DVD player, a digital camera, a copier, a printer, an IC tag, an IC card, an information processing apparatus, an image processing apparatus, a control apparatus, a communication apparatus, and others.

Although the PWB using glass-epoxy as an insulation material is discussed as an example of the board 153, the present invention can be applied to the wiring board using silicon (Si) or the like as the insulation material. In a case where the board 153 is made of silicon, aluminum (Al) instead of copper can be used as the metal mother material of the electrode. In this case, the thickness of the mother material layer 152a made of aluminum of the Au electrode 152 may be approximately 35 µm. Furthermore, the thickness of the intermediate layer 152b made by the nickel plating process or the thickness of the Au surface layer 152c made by the electrolytic plating process, as well as the case of the mother material layer 152a made of copper, may be several µm.

According to the above-discussed embodiment of the present invention, it is possible to provide a wiring board, including:
a substrate made of an insulation material and wired by a conductive material;
wherein a plurality of electrodes is formed on a surface of the substrate; and a non-Au electrode not having an Au surface layer and an Au electrode having the Au surface layer are formed as the electrodes.

When the small size electronic part such as the bare chip is soldered to the non-Au electrode having no Au surface layer, even if the amount of the solder provided between the electrode pad and the non-Au electrode is minute because the electrode pad of the small size electronic part is extremely small, gold is not educed from the non-Au electrode of the wiring board to the solder. Therefore, it is possible to avoid the fragility of the solder due to the large amount of educed gold of the electrode surface in the solder. In addition, since the Au electrode having the Au surface layer and the non-Au electrode having no Au surface layer, are formed, even if the Au electrode is used as the exposed contact electrode, the Au electrode works well.

An oxidation prevention film made of a material different from Au may be formed on a surface of the non-Au electrode.

The oxidation of the surface of the non-Au electrode without the Au surface layer is prevented by the oxidation prevention film made of non metal material such as a flux so that the surface of the non-Au electrode can be kept in a state where the solder can be adequately provided for a long time. Because of this, a large number of the wiring boards so made can be kept so that manufacturing cost of the electronic circuit board can be reduced.

The electrodes may bee formed on both surfaces of the substrate, all of the electrodes formed on a first surface of the substrate may be the non-Au electrodes, and all of the electrodes formed on a second surface of the substrate may be the Au electrodes.

Since all of the electrodes formed on a first surface of the substrate are non-Au electrodes and all of the electrodes formed on a second surface of the substrate are Au electrodes, it is possible to simplify the electrode forming process as compared with a case where different kinds of the electrodes, namely, the non-Au electrodes and the Au electrode, are mixed on the same surface. As a result of this, it is possible to reduce the manufacturing cost.

All of or a part of the non-Au electrodes may have plan areas less than 0.049 mm$^2$, and all of the Au electrodes may have plan areas equal to or greater than 0.049 mm$^2$.

At least a part of the non-Au electrodes have plan areas less than 0.049 mm$^2$ so that the non-Au electrodes can be used for mounting the small size flip chip. As a result of this, even if the chip is a small size bare chip, the chip can be surface mounted on one surface of a board as a flip chip. In addition, all of the Au electrodes have plan areas equal to or greater than 0.049 mm$^2$. Oxidation of all of the electrodes formed at other surface of the board can be prevented by the Au surface layer.

According to the above-discussed embodiment of the present invention, it is possible to provide a According to the above-discussed embodiment of the present invention, it is possible to provide an electronic circuit board, including:
a wiring board where a plurality of electrodes is formed on a surface of a substrate which substrate is made of an insulation material and wired by a conductive material; and
a plurality of electronic parts having contact electrodes configured to connect to the electrodes formed on the surface of the substrate, the electronic parts being surface-mounted on the wiring board;
wherein a non-Au electrode not having an Au surface layer and an Au electrode having the Au surface layer are formed as the electrodes formed on the surface of the substrate of the wiring board.

At least one of the electronic parts may have an Au electrode having an Au surface layer as the contact electrode, the Au surface layer may have a flat contact surface with an area greater than the area of a side surface of the Au surface layer, and the contact surface may be soldered to the non-Au electrode of the wiring board.

According to the above-discussed embodiment of the present invention, it is possible to provide an electronic circuit board, including:

a wiring board where a plurality of electrodes is formed on a surface of a substrate which substrate is made of an insulation material and wired by a conductive material; and a plurality of electronic parts having contact electrodes configured to connect to the electrodes formed on the surface of the substrate, the electronic parts being surface-mounted on the wiring board;

wherein the wiring board includes non-Au electrodes not having Au surface layers and Au electrodes having the Au surface layers as the electrodes;

at least one of the electronic parts has the Au electrode having the Au surface layer as the contact electrode;

the Au surface layer has a flat contact surface having an area greater than the area of a side surface of the Au surface layer; and the contact surface is soldered to the non-Au electrode of the wiring board.

It is possible to avoid the fragility of the solder due to the large amount of educed gold of the electrode surface of the wiring board and the contact electrode of the electronic part. That is, in the related art flip chip, for the purpose of prevention of bad connecting due to the oxidation of the connecting electrode for connecting the electrode of the wiring board, it is general practice for the gold bump to be formed on the surface of the contact electrode.

Figure 21:
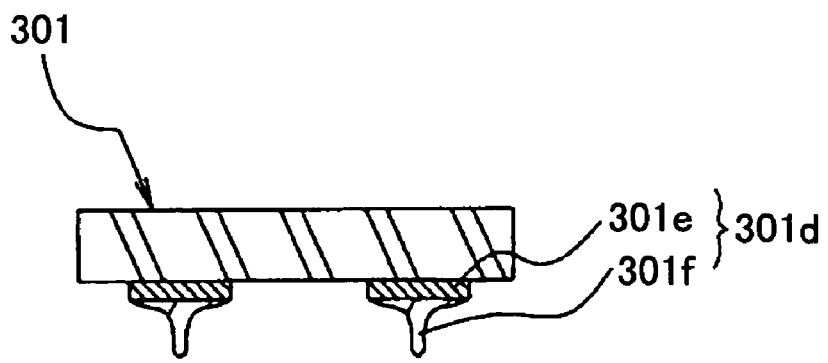
FIG. 21 is an expanded cross-sectional view showing a flip chip mounted on a board by a related art manufacturing method of an electronic circuit board.

FIG. 21 is an expanded cross-sectional view showing a flip chip mounted on a board by a related art manufacturing method of an electronic circuit board.

Referring to FIG. 21, plural contact electrodes 301d are formed on the surface of the flip chip 301. The contact electrode is formed by covering a surface of a flat metal mother material pad 301e made of the non-Au metal material such as nickel or aluminum, with an Au bump 301f. The gold bump 301f projects from the surface of the flat metal mother material pad 301e by use of a wire boding device used in the above-discussed old type COB process.

Figure 22:
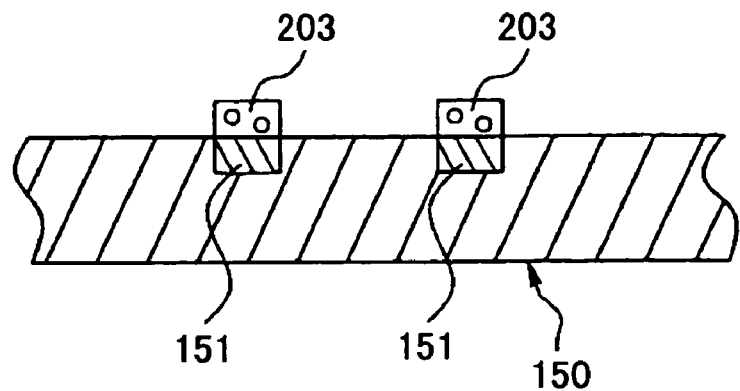
FIG. 22 is an expanded cross-sectional view showing a PWB where a related art flip chip is mounted.
Figure 23:
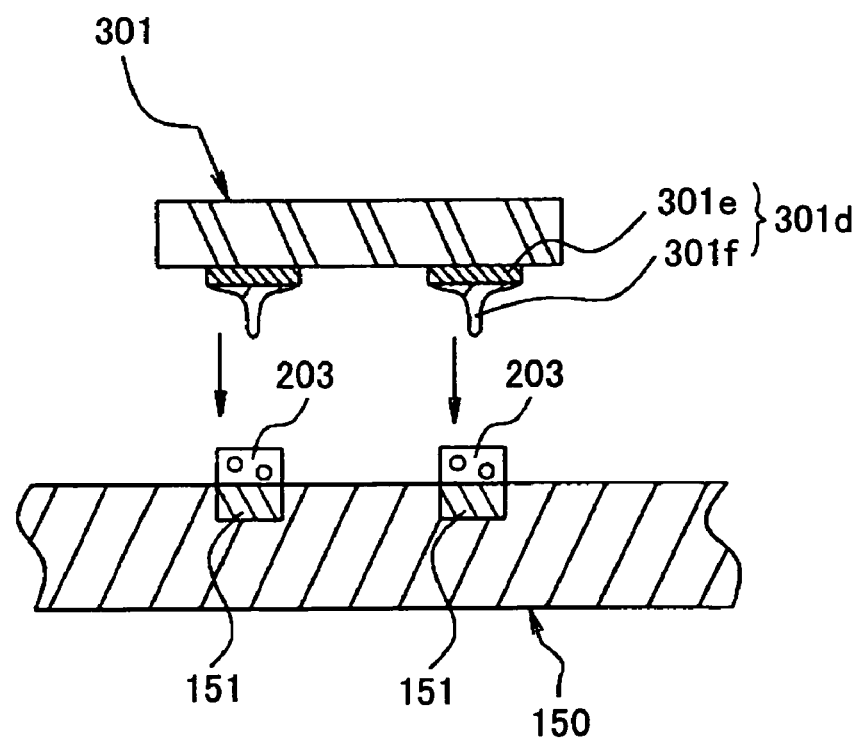
FIG. 23 is an expanded cross-sectional view showing a mounting process of the related art flip chip.

FIG. 22 is an expanded cross-sectional view showing a PWB where a related art flip chip is mounted. FIG. 23 is an expanded cross-sectional view showing a mounting process of the related art flip chip. FIG. 24 is an expanded cross-sectional view showing the related art flip chip mounted on the PWB.

In a case where such a flip chip 301 is surface mounted, first, as shown in FIG. 22, the solder paste lumps 203 are printed on the non-Au electrodes 151 of the PWB 150 as the wiring board.

As shown in FIG. 23, the flip chip 301 is mounted on the PWB 150 so that the solder paste lumps 203 and the contact electrodes 301d are stacked.

As a result of this, as shown in FIG. 24, the gold bump 301f of the contact electrode 301d is taken into the solder paste lump 203. When the reflow process is implemented, a large amount of gold of the gold bump 301f taken into the solder paste lump 203 is educed in the molten solder so that the solid solder becomes fragile. Because of this, an electronic part not having a gold projection provided on the surface of the contact electrode but having an Au flat contact surface layer whose area is larger than a side surface, is used. In such an electronic part, as shown in FIG. 21, the flat Au surface layer 301c made of gold and provided on a surface of the flat metal mother material pad 301b made of the non metal material is not taken in the solder paste lump 203 but comes in contact with only the surface of the solder paste lump 203. In this case, even if the reflow process is applied, gold is educed from the Au surface layer 301c into the molten solder at only the surface part of the paste lump 203. Therefore, the amount of gold educed into the molten solder is reduced as compared with the electronic part having the gold bump 301f. As a result of this, it is possible to avoid the fragility of the solder due to the gold being educed, of the contact electrodes of the electronic part.

A distance between a part mounting surface of the wiring board and an electrode forming surface of one of the electronic parts, for which one electrode part a plan area of the contact electrode is smallest among the plan areas of the contact electrodes of the electronic parts, may be equal to or less than 70 µm.

The electronic parts having the smallest plan areas of the contact electrodes, that is, the electronic parts such as the small size flip chips by which the signal transmission speed becomes high or noise mixture is reduced, are connected to the wiring board by a small amount of thin conductive connection material whereby the distance between the electrode forming surface and the part mounting surface of the wiring board after the reflow process is equal to or smaller than 70 µm. Since the small amount of thin conductive connection member has an electric resistance smaller than the related art, it is possible to make the signal transmission speed high and reduce the noise mixture.

A distance between the contact electrodes in an area of a periphery edge part of the electrode forming surface of the one electronic part for which one electronic part the plan area of the contact electrode is smallest may be equal to or greater than 500 µm, and an underfill may be provided between the electrode forming surface and the part mounting surface. At least one of the electronic parts may be flip chip mounted so that an integrated circuit forming surface faces the wiring board.

By providing the underfill material in the gap between the electrode forming surface of the small size electronic part and the part mounting surface of the wiring board, it is possible to avoid deformation toward the gap of the electronic part based on the difference of the thermal expansion rates of the electronic part and the wiring board. In addition, it is possible to prevent breakage of the conductive connection material based on the deformation. Furthermore, in a case where the distance between the electrode forming surface and the part mounting surface of the wiring board after the reflow process is equal to or smaller than 70 µm, it is possible to form an opening whose length in a substrate surface direction is equal to or greater than 500 µm in an area of the periphery edge part of the electronic part. Therefore, the underfill material can flow in from the opening so that the underfill process of the small size electronic part can be easily implemented.

According to the above-discussed embodiment of the present invention, it is possible to provide an electronic apparatus, including:

an electronic circuit board, including a wiring board where a plurality of electrodes is formed on a surface of a substrate which substrate is made of an insulation material and wired by a conductive material; and a plurality of electronic parts having contact electrodes configured to connect to the electrodes formed on the surface of the substrate, the electronic parts being surface-mounted on the wiring board; and
a housing covering the electronic circuit board;
wherein a non-Au electrode not having an Au surface layer and an Au electrode having the Au surface layer are formed as the electrodes formed on the surface of the substrate of the wiring board.

According to the above-discussed embodiment of the present invention, it is possible to provide an electronic apparatus, including:
an electronic circuit board, including
a wiring board where a plurality of electrodes is formed on a surface of a substrate which substrate is made of an insulation material and wired by a conductive material; and
a plurality of electronic parts having contact electrodes configured to connect to the electrodes formed on the surface of the substrate, the electronic parts being surface-mounted on the wiring board; and
a housing covering the electronic circuit board;
wherein a non-Au electrode not having an Au surface layer and an Au electrode having the Au surface layer are formed as the electrodes formed on the surface of the substrate of the wiring board of the electronic circuit board.

According to the above-discussed embodiment of the present invention, it is possible to provide a manufacturing method of an electronic circuit board where a plurality of electronic parts is surface-mounted on a wiring board which wiring board includes a substrate, the method including the steps of:
printing a paste lump made of a paste containing a conductive connection material on a plurality of electrodes formed on the substrate which substrate is made of an insulation material and wired by a conductive material;
mounting the electronic parts on the wiring board via the paste lump; and
connecting the electrodes of the wiring board to the corresponding contact electrodes of the electronic parts by melting the conductive connect material in the paste lump;
wherein the electrodes are formed on a surface of the substrate; and
a non-Au electrode not having an Au surface layer and an Au electrode having the Au surface layer are formed as the electrodes.

The paste lump printed on the electrodes of the wiring board in the printing step may have a thickness whereby a distance between a part mounting surface of the wiring board and an electrode forming surface of one of the electronic parts, for which one electrode part a plan area of the contact electrode is smallest among the plan areas of the contact electrodes of the electronic parts, is equal to or less than 70 μm.

By avoiding the cleaning process in an area facing the electrode forming surface in the part mounting surface, it is possible to reduce the manufacturing cost of the electronic circuit board. Although the underfill process cannot be done without the cleaning process in the related art, the cleaning process can be avoided because of the following reasons. In the related art, the amount of paste lump provided between the electrode forming surface of the electronic part and the part mounting surface of the wiring board is large and therefore a large amount of flux is supplied against the part mounting surface from the paste lump at the time of the reflow. Therefore, in the related art, at the time of the underfill process, the large amount of the flux adhered on the part mounting surface repels the underfill material so that flow-in of the underfill material is blocked. On the other hand, in the present invention, the amount of paste lumps provided between the electrode forming surface of the electronic part and the part mounting surface of the wiring board is extremely small and therefore the amount of flux supplied against the part mounting surface from the paste lump at the time of the reflow is small. Hence, in the present invention, the underfill material can flow in even if the cleaning process whereby the flux is cleaned is not implemented.

The present invention is not limited to the above-discussed embodiments, but variations and modifications may be made without departing from the scope of the present invention.

What is claimed is:

1. A wiring board comprising:
a substrate consisting of an insulation material and wired by a conductive material;
wherein a plurality of electrodes are formed on a surface of the substrate and include a non-Au electrode not having an Au surface layer and an Au electrode having the Au surface layer, and
an oxidation prevention film made of a flux of a non-metal material is formed on a surface of the non-Au electrode.

2. The wiring board as claimed in claim 1,
wherein the electrodes are formed on both surfaces of the substrate;
all of the electrodes formed on a first surface of the substrate are the non-Au electrodes; and
all of the electrodes formed on a second surface of the substrate are the Au electrodes.

3. The wiring board as claimed in claim 2,
wherein all of or a part of the non-Au electrodes have plan areas less than 0.049 mm$^2$; and
all of the Au electrodes have plan areas equal to or greater than 0.049 mm$^2$.

4. An electronic circuit board comprising:
a wiring board including a substrate consisting of an insulation material and wired by a conductive material, wherein a plurality of electrodes are formed on a surface of the substrate; and
a plurality of electronic parts having contact electrodes configured to connect to the electrodes formed on the surface of the substrate, the electronic parts being surface-mounted on the wiring board;
wherein the electrodes formed on the surface of the substrate of the wiring board include a non-Au electrode not having an Au surface layer and an Au electrode having the Au surface layer, and
an oxidation prevention film made of a flux of a non-metal material is formed on a surface of the non-Au electrode.

5. The electronic circuit board as claimed in claim 4,
wherein at least one of the electronic parts has an Au electrode having an Au surface layer as the contact electrode;
the Au surface layer has a flat contact surface with an area greater than the area of a side surface of the Au surface layer; and
the contact surface is soldered to the non-Au electrode of the wiring board.

6. An electronic circuit board comprising:
a wiring board including a substrate consisting of an insulation material and wired by a conductive material, wherein a plurality of electrodes are formed on a surface of the substrate; and
a plurality of electronic parts having contact electrodes configured to connect to the electrodes formed on the surface of the substrate, the electronic parts being surface-mounted on the wiring board, wherein the electrodes formed on the surface of the substrate of the wiring board include non-Au electrodes not having Au surface layers and Au electrodes having the Au surface layers as the electrodes, at least one of the electronic parts has an Au electrode having an Au surface layer as the contact electrode of the electronic part, the Au surface layer of the contact electrode of the electronic part having a flat contact surface with an area greater than the area of a side surface of the Au surface layer, the contact surface is soldered to the non-Au electrode of the wiring board, and an oxidation prevention film made of a flux of a non-metal material is formed on a surface of the non-Au electrode.

7. The electronic circuit board as claimed in claim 6, wherein a distance between a part mounting surface of the wiring board and an electrode forming surface of one of the electronic parts, for which one electrode part a plan area of the contact electrode is smallest among the plan areas of the contact electrodes of the electronic parts, is equal to or less than 70 μm.

8. The electronic circuit board as claimed in claim 7, wherein a distance between the contact electrodes in an area of a periphery edge part of the electrode forming surface of the one electronic part for which one electronic part the plan area of the contact electrode is smallest is equal to or greater than 500 μm; and an underfill is provided between the electrode forming surface and the part mounting surface.

9. The electronic circuit board as claimed in claim 6, wherein at least one of the electronic parts is flip chip mounted so that an integrated circuit forming surface faces the wiring board.

10. The electronic circuit board as claimed in claim 6, wherein the electrodes are formed on both surfaces of the substrate;

all of the electrodes formed on a first surface of the substrate are non-Au electrodes; and all of the electrodes formed on a second surface of the substrate are Au electrodes.

11. An electronic apparatus comprising:

an electronic circuit board including a wiring board including a substrate consisting of an insulation material and wired by a conductive material, wherein a plurality of electrodes are formed on a surface of the substrate; and a plurality of electronic parts having contact electrodes configured to connect to the electrodes formed on the surface of the substrate, the electronic parts being surface-mounted on the wiring board; and a housing covering the electronic circuit board;

wherein the electrodes formed on the surface of the substrate of the wiring board include a non-Au electrode not having an Au surface layer and an Au electrode having the Au surface layer, and an oxidation prevention film made of a flux of a non-metal material is formed on a surface of the non-Au electrode.

12. An electronic apparatus, comprising:

an electronic circuit board, including a wiring board including a substrate consisting of an insulation material and wired by a conductive material, wherein a plurality of electrodes are formed on a surface of the substrate; and a plurality of electronic parts having contact electrodes configured to connect to the electrodes formed on the surface of the substrate, the electronic parts being surface-mounted on the wiring board; and a housing covering the electronic circuit board;

wherein the electrodes formed on the surface of the substrate of the wiring board of the electronic circuit board include a non-Au electrode not having an Au surface layer and an Au electrode having the Au surface layer, and an oxidation prevention film made of a flux of a non-metal material is formed on a surface of the non-Au electrode.

13. A manufacturing method of an electronic circuit board where a plurality of electronic parts are surface-mounted on a wiring board including a substrate consisting of an insulation material and wired by a conductive material, the method comprising the steps of:

printing a paste lump made of a paste containing a conductive connection material on a plurality of electrodes formed on the substrate consisting of the insulation material;

mounting the electronic parts on the wiring board via the paste lump; and connecting the electrodes of the wiring board to the corresponding contact electrodes of the electronic parts by melting the conductive connect material in the paste lump;

wherein the electrodes are formed on a surface of the substrate and include a non-Au electrode not having an Au surface layer and an Au electrode having the Au surface layer, and an oxidation prevention film made of a flux of a non-metal material is formed on a surface of the non-Au electrode.

14. The manufacturing method of an electronic circuit board as claimed in claim 13, wherein the paste lump printed on the electrodes of the wiring board in the printing step has a thickness whereby a distance between a part mounting surface of the wiring board and an electrode forming surface of one of the electronic parts, for which one electrode part a plan area of the contact electrode is smallest among the plan areas of the contact electrodes of the electronic parts, is equal to or less than 70 μm.

15. The manufacturing method of the electronic circuit board as claimed in claim 14, wherein a distance between the contact electrodes in an area of a periphery edge part of the electrode forming surface of the one electronic part for which one electronic part the plan area of the contact electrode is smallest is equal to or greater than 500 μm; and an underfill step is implemented after the connecting step so that an underfill material flows from a space between the area of the part of the periphery edge part of the electrode forming surface and the part mounting surface to a part under the electrode forming surface.

16. The manufacturing method of an electronic circuit board as claimed in claim 15, wherein the underfill step is implemented without cleaning an area of the part mounting surface facing the electrode forming surface.

17. The wiring board of claim 1, wherein the flux is formed by liquefying a rosin made of an aliphatic carboxylic acid in a solvent.

* * * * *